US 6,657,436 B1

United States Patent
Eslambolchi et al.

(10) Patent No.: US 6,657,436 B1
(45) Date of Patent: Dec. 2, 2003

(54) SHEATH MONITORING TECHNIQUE

(75) Inventors: Hossein Eslambolchi, Los Altos Hills, CA (US); John Sinclair Huffman, Conyers, GA (US)

(73) Assignee: AT&T Corp., New York, NY (US)

( * ) Notice: Subject to any disclaimer, the term of this patent is extended or adjusted under 35 U.S.C. 154(b) by 69 days.

(21) Appl. No.: 10/012,728

(22) Filed: Oct. 30, 2001

(51) Int. Cl.[7] ............................................... G01R 31/08
(52) U.S. Cl. ...................................... 324/532; 324/512
(58) Field of Search ............................. 324/71.1, 509, 324/522, 523, 527, 528, 529, 556, 512, 532; 379/26; 405/157, 175

(56) References Cited

U.S. PATENT DOCUMENTS 6,026,145 A * 2/2000 Bauer et al. .................. 379/26
6,104,197 A * 8/2000 Kochan ....................... 324/533
6,181,140 B1 * 1/2001 Vokey et al. ................ 324/523
6,459,271 B1 * 10/2002 Vokey et al. ................ 324/522

* cited by examiner

Primary Examiner—Jay Patidar
Assistant Examiner—Walter Benson

(57) ABSTRACT

A system (10) for monitoring a cable (14) for fault in the metallic sheath (12) includes a transmitter (16) for applying a signal to a first end of the metallic member at periodic intervals. A receiver (18) periodically measures what if any signal exists at a second end of the metallic member in synchronism with the application of the signal so that each measurement is made not long longer than the interval during which the signal is applied to the metallic member. The receiver communicates the measurements to a central facility for evaluation to determine whether the metallic member exhibits a fault.

1 Claim, 1 Drawing Sheet

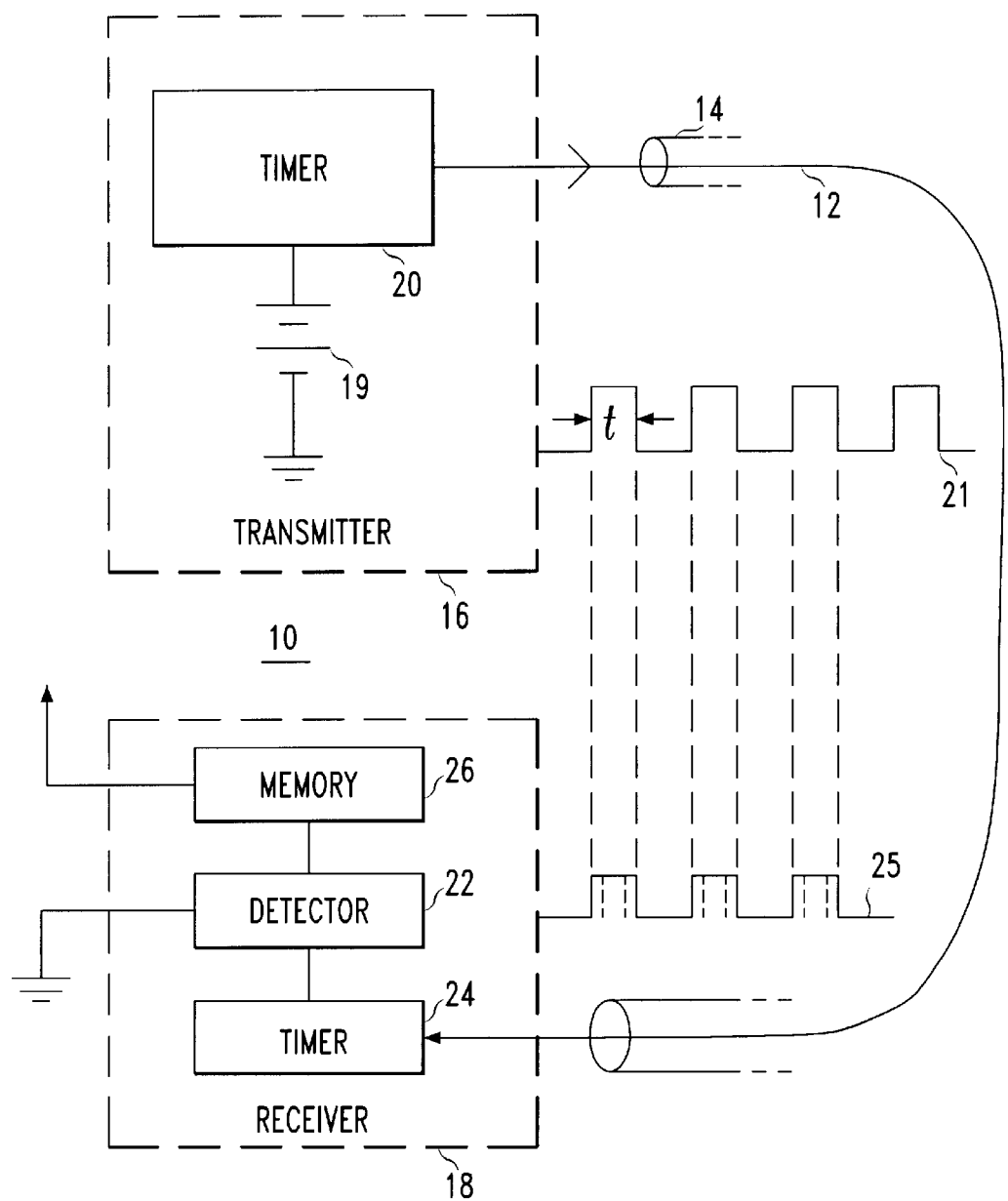

SHEATH MONITORING TECHNIQUE

FIELD OF THE INVENTION

This invention relates to a technique for monitoring the metallic sheath of an optical cable fiber prior to service on the cable.

BACKGROUND ART

Virtually all providers of long-haul communications services, such as AT&T, now employ optical fiber cables to carry traffic associated with such communications services. A typical optical fiber cable for carrying communications traffic includes one or more optical fibers and a metallic member, usually in the form of a metallic sheath that surrounds the fiber. A plastic cover surrounds the sheath to protect the sheath and the fibers from the elements. In the event that the optical fiber cable is buried underground, the metallic sheath carries a locating signal (tone) that facilitates location of the buried cable in the event of a need for repair or replacement.

Installation of an optical fiber cable, whether above or below ground commences by laying the cable itself. Following laying of the cable, regeneration equipment is installed at spaced apart locations along the cable. The regeneration equipment includes one or more amplifiers for boosting the signal to compensate for losses, as well as a signal generator for applying a cable-locating signal to the cable sheath in the event the cable is buried underground. Usually, installation of the regeneration equipment quickly follows laying of the optical fiber cable so that service can be turned up on the cable as rapidly as possible. However, in some instances, installation of the regeneration equipment may lag the laying of the cable by several months or more because of various delays.

During the interval between laying of the cable and installation of the regeneration equipment (including the locating signal generator for an underground cable), no effective way exists to monitor the condition of the cable sheath. Occasionally, damage may occur to the sheath of the fiber optic cable during installation. For example, during the laying of the cable, the plastic covering may suffer scrapes or nicks that expose the sheath to damage, thus creating a sheath fault. Sheath faults reduce the life expectancy of the cable, especially if the sheath carries a large amplitude cable-locating signal. Moreover, the presence of one or more sheath faults may lead to corrosion and increase the degree of cable damage in the event the cable is struck by lightning.

Thus, there is a need for technique for monitoring the sheath of an optical fiber cable during the interval between laying of the cable and installation of regeneration and cable locating mechanisms.

BRIEF SUMMARY OF THE INVENTION

Briefly, the present invention provides a technique for monitoring the metallic member (e.g., a sheath) of a cable that otherwise carries no signals, as would typically occur during the time between laying the cable and connecting regeneration equipment to the cable at various locations therealong. In accordance with a preferred embodiment of the invention, a signal, typically a 48-volt DC signal, is applied to the metallic member at first periodic intervals for a prescribed duration during each interval. The level of the signal applied to metallic member is measured in synchronism with the periodic application of the signal such that each signal measurement is made not longer than the predetermined duration during which the signal is applied. The measurements are communicated to a central facility for evaluation to determine whether the metallic member exhibits a fault conditions. Preferably, the measurements are accumulated for storage and then are relayed to the central facility in batch.

BRIEF SUMMARY OF THE DRAWING

FIG. 1 depicts a block schematic diagram of a system in accordance with a preferred embodiment of the invention for monitoring a metallic member of a cable.

DETAILED DESCRIPTION

FIG. 1 depicts a system 10 in accordance with a preferred embodiment of the present invention for monitoring a metallic member 12 of a cable 14. In practice the metallic member comprises the sheath of an optical fiber cable that has been laid, but not yet turned-up for service. In other words, the cable 14 otherwise carries no signals, and particularly, the metallic member 12 carries no locating signal.

To enable monitoring of the metallic member 12, the system 10 includes a transmitter 16 for periodically applying a signal, typically a DC voltage, to one end of the metallic member for detection by a receiver 18 coupled to the other end of the metallic member. The transmitter 16 includes a battery 19, typically a 48-volt battery with reserve. The battery 19 has its negative terminal connected to circuit ground, and its positive terminal connected to an input of a timer 20 whose output is coupled to the first end of the metallic member 12. The timer 20 operates to periodically connect the positive terminal of the battery 19 to a first end of the metallic member 12. In this way, the timer 20 causes the 48-volt DC voltage to appear on the metallic member 12 at periodic intervals, each of a predetermined duration t, as represented by the square-wave signal 21. Thus, the combination of the battery 18 and timer 20 form a square wave signal generator.

Applying a DC voltage periodically to the metallic member 12 for a predetermined duration t has several advantages as compared to applying a constant voltage. First, periodically applying the voltage to the metallic member 12 conserves battery life. Secondly, periodically applying the voltage reduces the degree to which the voltage will accelerate a fault in the metallic member 12.

The receiver 18 monitors the voltage appearing between circuit ground and the second end of the metallic member. To that end, the receiver 18 includes a voltage detector 22 having a first input terminal coupled to circuit ground, and a second input coupled to a timer 24 that periodically connects the detector to the second end of the metallic member 12 in synchronism with the timer 20. In other words, the timer 24 connects the detector 22 to the opposite end of the metallic member 12 each time the timer 20 connects the battery 19 so that the detector is "on" at the same time as the timer 20 for a duration that does not exceed t seconds as represented by the square wave 25. Thus, the "on" interval of timer 24 must not exceed the "on" interval when the timer 20 connects the battery 19 to the metallic member 12. Otherwise the detector 22 could read a "no voltage" condition simply because the timer 20 has temporarily disconnected the battery 19 from the metallic member 12, not because of any loss of continuity of the metallic member.

However, the timer 24 need not remain "on" for the entire interval t as indicated by the dashed lines in the square wave 25. In other words, the timer 24 could place the detector 22 in an "on" state after the timer 20 connects the battery 19 to the metallic member 12 and the timer 24 could disconnect the detector 22 before the timer 20 disconnects the battery 19. By making the detector 22 turn on "late" and turn off "early" with respect to the timer 20, the timer 24 would reduce the likelihood of a false reading by the detector.

The receiver includes a memory 26 for storing the periodic readings made by the detector 22. At various intervals, typically each longer that the interval between the "on" and "off" state of the detector 22, the memory 26 will output the stored readings, typically via a RS 232 port for communication to a central facility to allow for monitoring of the metallic member. The memory 26 may output the stored detector readings on an ad-hoc basis, such as upon a query from the central facility, or the memory may output the detector readings at regular (periodic) intervals.

At the central facility, the measurements are evaluated. If there exist a prescribed quantity of measured signal strength values that each fall below a threshold value, thus representing a failure to detect an acceptable voltage level for an extended interval (taking into account for expected losses), then such measurements would signal a sheath fault and appropriate action can then be taken to make the needed repairs.

The transmitter 16 and the detector 18 are each packaged in watertight housing to permit outdoor deployment. In this way, the system 10 can be deployed in the field to monitor the sheath of a cable, once the cable is laid but before any serviced is turned up on the cable.

The foregoing describes a technique for monitoring the metallic sheath of an optical cable fiber or the like prior to service on the cable.

The above-described embodiments merely illustrate the principles of the invention. Those skilled in the art may make various modifications and changes that will embody the principles of the invention and fall within the spirit and scope thereof.

What is claimed is:

1. Apparatus for monitoring a metallic member of a cable that otherwise carries no signals, comprising:
   a transmitter for applying a signal to a first end of the metallic member at periodic intervals; and
   a receiver comprising
      a detector for measuring what if any signal exists at a second end of the metallic member;
      a timer for connecting the detector to the second end of the metallic member in synchronism with the application of the signal to the first end of the metallic member; and
      a memory for storing each measurement made by the detector the receiver periodically measuring what if any signal exists at the second end of the metallic member in synchronism with the application of the signal so that each measurement is made not long longer than the interval during which the signal is applied to the metallic member; and the receiver communicating the measurements to a central facility for evaluation to determine whether the metallic member exhibits a fault condition.

* * * * *